(12) United States Patent
Okumura et al.

(10) Patent No.: US 11,152,210 B2
(45) Date of Patent: Oct. 19, 2021

(54) SEMICONDUCTOR CRYSTAL SUBSTRATE, INFRARED DETECTOR, AND METHOD FOR PRODUCING SEMICONDUCTOR CRYSTAL SUBSTRATE

(71) Applicant: FUJITSU LIMITED, Kawasaki (JP)

(72) Inventors: Shigekazu Okumura, Setagaya (JP); Shuichi Tomabechi, Atsugi (JP); Ryo Suzuki, Fujisawa (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 17/121,846

(22) Filed: Dec. 15, 2020

(65) Prior Publication Data

US 2021/0143009 A1 May 13, 2021

Related U.S. Application Data

(63) Continuation of application No. 16/272,027, filed on Feb. 11, 2019, now Pat. No. 10,937,647, which is a
(Continued)

(51) Int. Cl.
*H01L 21/02* (2006.01)
*H01L 29/205* (2006.01)
(Continued)

(52) U.S. Cl.
CPC ......... *H01L 21/02502* (2013.01); *G01J 1/02* (2013.01); *G01J 1/0407* (2013.01); *G01J 1/44* (2013.01); *H01L 21/02398* (2013.01); *H01L 21/02466* (2013.01); *H01L 21/02546* (2013.01); *H01L 21/02549* (2013.01);
(Continued)

(58) Field of Classification Search
CPC ......... H01L 21/02398; H01L 21/02466; H01L 21/02502; H01L 21/02631
See application file for complete search history.

(56) References Cited

U.S. PATENT DOCUMENTS

| | | |
|---|---|---|
| 5,492,860 A | 2/1996 | Ohkubo et al. |
| 2009/0045395 A1 | 2/2009 | Kim et al. |

(Continued)

FOREIGN PATENT DOCUMENTS

| | | | |
|---|---|---|---|
| CN | 104134712 A | * | 11/2014 |
| CN | 104518054 B | | 8/2016 |

(Continued)

OTHER PUBLICATIONS

Chen et al.; Growth and fabrication of InAs/GaSb type II superlattice mid-wavelength infrared photodetectors; Nanoscale Research Letters 2011, 6:635 (Year: 2011).*

(Continued)

*Primary Examiner* — Syed I Gheyas
(74) *Attorney, Agent, or Firm* — Westerman, Hattori, Daniels & Adrian, LLP

(57) ABSTRACT

A semiconductor crystal substrate includes a crystal substrate that is formed of a material including GaSb or InAs, a first buffer layer that is formed on the crystal substrate and formed of a material including GaSb, the first buffer layer having n-type conductivity, and a second buffer layer that is formed on the first buffer layer and formed of a material including GaSb, the second buffer layer having p-type conductivity.

4 Claims, 16 Drawing Sheets

Related U.S. Application Data continuation of application No. PCT/JP2016/075431, filed on Aug. 31, 2016.

(51) Int. Cl.

| | | |
|---|---|---|
| *H01L 35/26* | (2006.01) | |
| *H01S 5/343* | (2006.01) | |
| *H01L 29/78* | (2006.01) | |
| *G01J 1/02* | (2006.01) | |
| *H01L 27/146* | (2006.01) | |
| *H01L 33/00* | (2010.01) | |
| *H01L 27/144* | (2006.01) | |
| *H01L 31/10* | (2006.01) | |
| *H01L 21/20* | (2006.01) | |
| *H01L 21/203* | (2006.01) | |
| *G01J 1/04* | (2006.01) | |
| *G01J 1/44* | (2006.01) | |
| *H01L 21/28* | (2006.01) | |
| *H01L 29/15* | (2006.01) | |
| *H01L 29/66* | (2006.01) | |
| *H01L 29/778* | (2006.01) | |
| *H01L 31/0304* | (2006.01) | |
| *H01L 31/0352* | (2006.01) | |
| *H01L 31/0392* | (2006.01) | |
| *H01L 31/18* | (2006.01) | |
| *H01L 33/06* | (2010.01) | |
| *H01L 33/12* | (2010.01) | |
| *H01L 33/30* | (2010.01) | |
| *H01L 35/18* | (2006.01) | |
| *H01L 35/32* | (2006.01) | |
| *H01L 35/34* | (2006.01) | |
| *H01S 5/22* | (2006.01) | |

(52) U.S. Cl.
CPC ........ *H01L 21/02631* (2013.01); *H01L 21/20* (2013.01); *H01L 21/203* (2013.01); *H01L 21/28264* (2013.01); *H01L 27/144* (2013.01); *H01L 27/146* (2013.01); *H01L 27/1467* (2013.01); *H01L 27/14694* (2013.01); *H01L 29/157* (2013.01); *H01L 29/205* (2013.01); *H01L 29/66462* (2013.01); *H01L 29/7785* (2013.01); *H01L 29/78* (2013.01); *H01L 31/0304* (2013.01); *H01L 31/0392* (2013.01); *H01L 31/035236* (2013.01); *H01L 31/10* (2013.01); *H01L 31/184* (2013.01); *H01L 33/00* (2013.01); *H01L 33/0062* (2013.01); *H01L 33/06* (2013.01); *H01L 33/12* (2013.01); *H01L 33/30* (2013.01); *H01L 35/18* (2013.01); *H01L 35/26* (2013.01); *H01L 35/32* (2013.01); *H01L 35/34* (2013.01); *H01S 5/22* (2013.01); *H01S 5/343* (2013.01)

(56) References Cited

U.S. PATENT DOCUMENTS

| | | |
|---|---|---|
| 2011/0260278 A1 | 10/2011 | Prineas et al. |
| 2012/0223362 A1* | 9/2012 | Belenky ............ H01L 31/03046 257/190 |
| 2013/0183815 A1 | 7/2013 | Sanchez et al. |
| 2015/0115321 A1 | 4/2015 | Yang et al. |
| 2015/0372174 A1 | 12/2015 | Kyono et al. |
| 2016/0035931 A1 | 2/2016 | Zhurtanov et al. |

FOREIGN PATENT DOCUMENTS

| | | |
|---|---|---|
| JP | 5-299358 A | 11/1993 |
| JP | 2003-115455 A | 4/2003 |
| JP | 2006-319034 A | 11/2006 |
| JP | 2015-512139 A | 4/2015 |
| JP | 2015-88756 A | 5/2015 |
| JP | 2015-173195 A | 10/2015 |
| JP | 2015-535141 A | 12/2015 |
| JP | 2016-9716 A | 1/2016 |
| RU | 2370854 C1 | 10/2009 |

OTHER PUBLICATIONS

International Search Report dated Nov. 8, 2016, issued in counterpart application No. PCT/JP2016/075431 (3 pages).
Lee et al., "A photoluminescence and Halleffect study of GaSb grown by molecularbeam epitaxy", Journal of Applied Physics, Apr. 1986, vol. 59, No. 8, pp. 2895-2900, cited in Specification (7 pages).
Wang, C.A., et al., "Lattice-Matched GaInAsSb/ AlGaAsb/GaSb Materials for Thermophotovoltaic Devices", AIP Conference Proceedings, Jan. 2003, vol. 653, pp. 324-334; Cited in Extended (Supplemental) EP Search Report dated Aug. 7, 2019. (12 pages).
Eyink, K.G., et al., "Characterization of low-temperature grown AlSb and GaSb buffer layers", Journal of Vacuum Science & Technology B: Microelectronics Proceeding and Phenomena, Jul. 1997, vol. 15, No. 4, p. 1187. (5 pages).
Extended (Supplemental) European Search Report dated Aug. 7, 2019, issued in counterpart EP Application No. 16915095.0. (10 pages).
Office Action dated Jun. 23, 2020, issued in counterpart JP application No. 2018-536573, with English translation. (26 pages).

* cited by examiner

SEMICONDUCTOR CRYSTAL SUBSTRATE, INFRARED DETECTOR, AND METHOD FOR PRODUCING SEMICONDUCTOR CRYSTAL SUBSTRATE

CROSS-REFERENCE TO RELATED APPLICATIONS

This application is a divisional of U.S. application Ser. No. 16/272,027, filed on Feb. 11, 2019, which is a continuation application of International Application PCT/JP2016/075431 filed on Aug. 31, 2016 and designated the U.S., the entire contents of which are incorporated herein by reference.

FIELD

The disclosures herein relate to a semiconductor crystal substrate, an infrared detector, and a method for producing the semiconductor crystal substrate.

BACKGROUND

As an apparatus for detecting infrared, there are infrared detectors formed of semiconductor materials. Examples of such infrared detectors include an infrared detector that has a structure in which an infrared absorption layer with an InAs/GaSb superlattice structure is formed on a GaSb substrate. The InAs/GaSb superlattice structure forming the infrared absorption layer is a type-II superlattice (T2SL) structure and has a type-II band lineup. Accordingly, by adjusting the film thickness and the period of the superlattice of the InAs/GaSb superlattice structure, it is possible to obtain an infrared detector that is sensitive in a wavelength range from a middle wave (MW) infrared of 3 to 5 µm to a long wave (LW) infrared of 8 to 10 µm.

A PIN-type infrared detector with a T2SL structure uses inter-band optical absorption. For this reason, a PIN-type infrared detector with a T2SL structure is expected to have improved temperature characteristics as compared to a quantum dot infrared photodetector (QDIP) and a quantum well infrared photodetector (QWIP) that use inter-subband optical absorption. In such a PIN-type infrared detector with a T2SL structure, it is desirable to have high light sensitivity and low dark current in addition to improved temperature characteristics.

In order to obtain high light sensitivity and low dark current in a PIN-type infrared detector with a T2SL structure, a high-quality T2SL crystal needs to be formed in an infrared absorption layer, and in order to form the high-quality T2SL crystal, a GaSb buffer layer with high flatness needs to be formed below the infrared absorption layer. For example, Non-Patent Document 1 proposes improving the quality of a GaSb buffer layer by changing a growth temperature and a V/III ratio in a molecular beam epitaxy (MBE) method. To be more specific, Non-Patent Document 1 discloses that an excellent GaSb layer can be obtained by epitaxially growing the GaSb layer at a growth temperature of 500° C. to 550° C. and a V/III ratio of 5 to 10.

However, it is not possible to obtain a high-quality T2SL crystal that fully satisfies desired characteristics of an infrared absorption layer by merely changing conditions under which a GaSb buffer layer is formed.

RELATED-ART DOCUMENTS

Patent Documents

[Patent Document 1] Japanese Laid-open Patent Publication No. 5-299358

[Patent Document 2] Japanese National Publication of International Patent Application No. 2015-512139

Non-Patent Documents

[Non-Patent Document 1] M. Lee et al., Journal of Applied Physics 59, 2895 (1986).

SUMMARY

According to an aspect of the embodiments, a semiconductor crystal substrate includes a crystal substrate that is formed of a material including GaSb or InAs, a first buffer layer that is formed on the crystal substrate and formed of a material including GaSb, the first buffer layer having n-type conductivity, and a second buffer layer that is formed on the first buffer layer and formed of a material including GaSb, the second buffer layer having p-type conductivity.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

Figure 1:
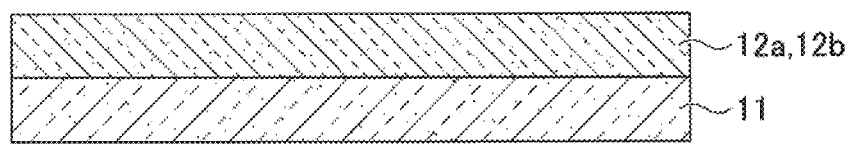
FIG. 1 is a structural drawing illustrating a semiconductor crystal substrate including a GaSb substrate on which a GaSb layer is formed.

According to at least one embodiment, it is possible to provide a semiconductor crystal substrate that includes a GaSb layer having high surface flatness.

In the following, embodiments of the present invention will be described with reference to the accompanying drawings.

In the following, embodiments of the present invention will be described with reference to the accompanying drawings. The same components are denoted by the same reference numerals throughout the drawings, and a duplicate description thereof will be omitted.

First Embodiment

First, a relationship between film forming conditions and flatness of a GaSb film was investigated. To be more specific, as illustrated in FIG. 1, a GaSb layer 12a and a GaSb layer 12b were each formed on a GaSb substrate 11 under different film forming conditions so as to prepare a semiconductor crystal substrate, and flatness of surfaces of the GaSb layer 12a and the GaSb layer 12b was measured. The flatness of the surfaces of the GaSb layer 12a and the GaSb layer 12b was measured by an atomic force microscope (AFM). Each of the GaSb layer 12a and the GaSb layer 12b was formed by solid source molecular-beam epitaxy (MBE) at a V/III ratio of approximately 10.

Figure 2:
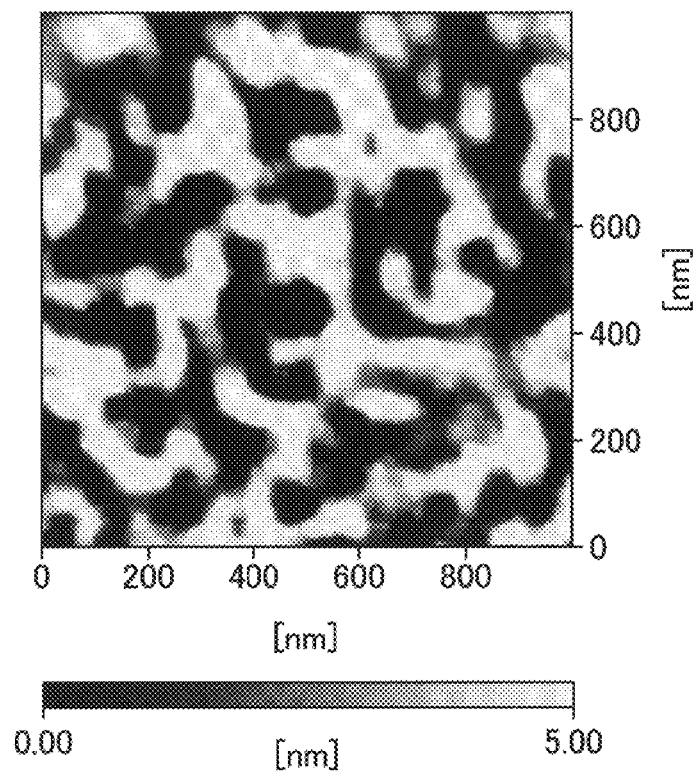
FIG. 2 is an AFM image of a surface of the GaSb substrate.

An oxide film formed by oxidation on the surface of the GaSb substrate 11 was removed by heating the GaSb substrate 11 at a temperature of approximately 500° C. under vacuum. FIG. 2 is an AFM image of the surface of the GaSb substrate 11 in this state. As illustrated in FIG. 2, recesses and projections were created by removing the oxide film from the surface of the GaSb substrate 11 made of a semiconductor crystal. Surface roughness (RMS) of the GaSb substrate 11, from which the oxide film was removed, was measured and was 3.1 nm. The measurement range of the surface roughness (RMS) was 1 μm×1 μm, which also applies to the GaSb layers described later.

Figure 3:
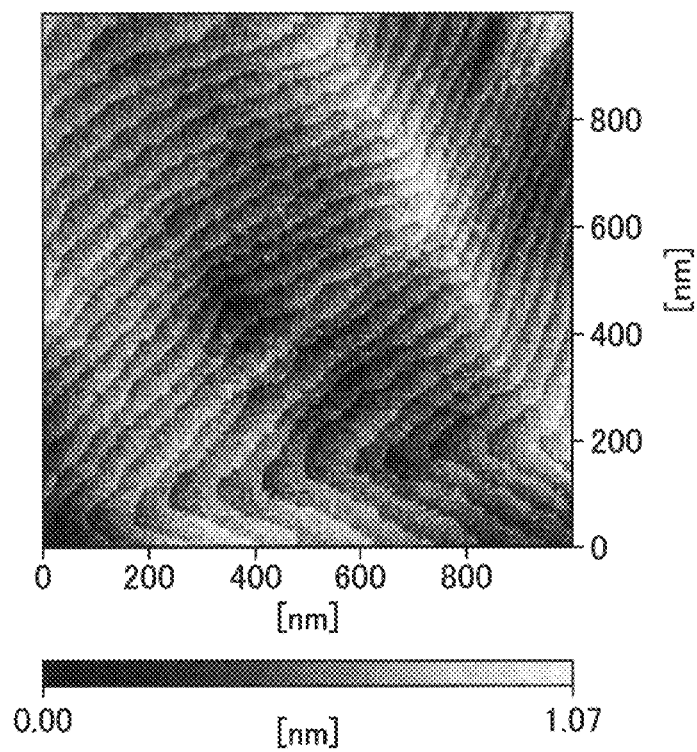
FIG. 3 is an AFM image of a GaSb layer formed on the GaSb substrate at a substrate temperature of 440° C.

Next, at a substrate temperature of 440° C., the GaSb layer 12a with a thickness of 500 nm was formed by MBE on the GaSb substrate 11 from which the oxide film was removed. FIG. 3 is an AFM image of the surface of the GaSb layer 12a formed in this way. Surface roughness (RMS) of the GaSb layer 12a was 0.16 nm.

Figure 4:
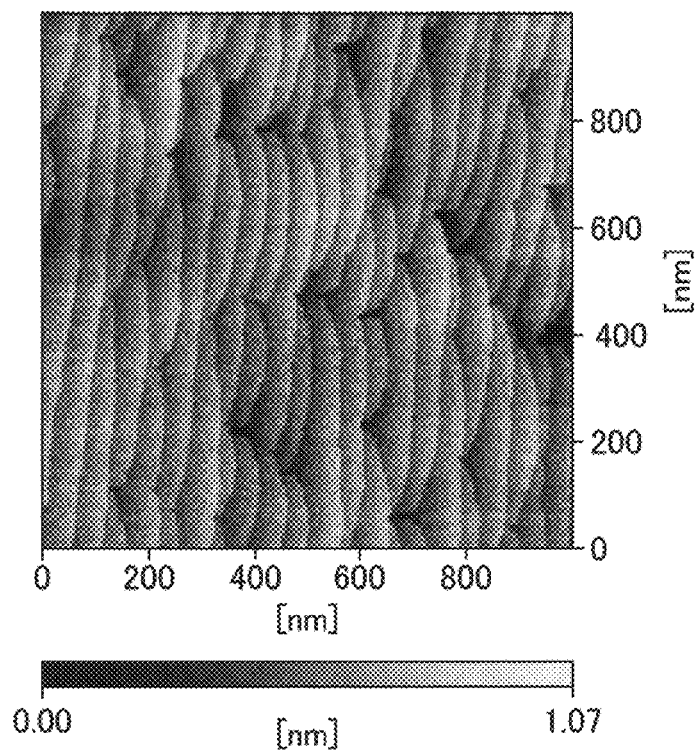
FIG. 4 is an AFM image of a GaSb layer formed on the GaSb substrate at a substrate temperature of 520° C.

Meanwhile, at a substrate temperature of 520° C., the GaSb layer 12b with a thickness of 500 nm was formed by MBE on the GaSb substrate 11 from which the oxide film was removed. FIG. 4 is an AFM image of the surface of the GaSb layer 12b formed in this way. Surface roughness (RMS) of the GaSb layer 12b was 0.13 nm. Thus, the surface of the semiconductor crystal substrate can be made flat by forming the GaSb layer 12b. Accordingly, the surface roughness (RMS) of the GaSb layer 12b formed at the substrate temperature of 520° C. can become smaller than that of the GaSb layer 12a, allowing the surface of the semiconductor crystal substrate, which is the GaSb substrate, to be made flat.

As illustrated in FIG. 4, recesses such as pits are created on the surface of the GaSb layer 12b formed at the substrate temperature of 520° C. Such pits are relatively deep, have a depth of several nm, and are present at a density of approximately $10^9$ cm$^{-2}$. When an infrared absorption layer with a T2SL structure is formed on the surface of the GaSb layer 12b having such pits, dislocation or a defect tends to be formed on the infrared absorption layer due to the pits. This may result in a decrease in light sensitivity or an increase in dark current of an infrared detector.

Conversely, as illustrated in FIG. 3, while pits are not created on the surface of the GaSb layer 12a formed at the substrate temperature of 440° C., the surface roughness of the GaSb layer 12a is larger than that of the GaSb layer 12b formed at the substrate temperature of 520° C.

Next, conductivity of the GaSb layer 12a and conductivity of the GaSb layer 12b formed at the different substrate temperatures were examined. As a result, it was found that the GaSb layer 12a formed by MBE at the substrate temperature of 440° C. had n-type conductivity, and the GaSb layer 12b formed by MBE at the substrate temperature of 520° C. had p-type conductivity. Also, a carrier concentration in the GaSb layer 12a formed at the substrate temperature of 440° C. and a carrier concentration in the GaSb layer 12b formed at the substrate temperature of 520° C. were measured by a capacitance-voltage (CV) method. The carrier concentration in the GaSb layer 12a was approximately $4\times10^{18}$ cm$^{-3}$, and the carrier concentration in the GaSb layer 12b was approximately $4\times10^{18}$ cm$^{-3}$. Further, the GaSb layer 12a and the GaSb layer 12b were analyzed by secondary ion mass spectrometry (SIMS), and a concentration of an impurity element in each of the GaSb layer 12a and the GaSb layer 12b was less than or equal to $1\times10^{17}$ cm$^{-3}$.

Accordingly, when the substrate temperature is low, the removal of Sb from the formed GaSb layer is suppressed, and the amount of Sb contained in the GaSb layer 12a formed by MBE at the substrate temperature of 440° C. is thus slightly greater than the amount of Ga. Therefore, it is assumed that Sb partially enters a Ga site of a GaSb crystal and functions as a donor, and as a result, the GaSb layer 12a exhibits n-type conductivity. Also, when the substrate temperature is high, Sb tends to be readily removed from the formed GaSb layer, and the amount of Ga contained in the GaSb layer 12b formed by MBE at the substrate temperature of 520° C. is thus slightly greater than the amount of Sb. Therefore, it is assumed that Ga partially enters a Sb site of a GaSb crystal and functions as an acceptor, and as a result, the GaSb layer 12b exhibits p-type conductivity.

When the substrate temperature during the formation of a GaSb layer is high, the surface migration movement of Ga atoms becomes active. On the other hand, when the substrate temperature is low, the surface migration movement of Ga atoms becomes less active. Accordingly, it is assumed that the migration distance of Ga atoms on the surface of the GaSb layer 12b formed at the substrate temperature of 520° C. becomes longer, and as a result, the surface of the GaSb layer 12b becomes flatter than the surface of the GaSb layer 12a formed at the substrate temperature of 440° C., and also the surface roughness (RMS) of the GaSb layer 12b becomes smaller than that of the GaSb layer 12a.

(Semiconductor Crystal Substrate)

Figure 5:
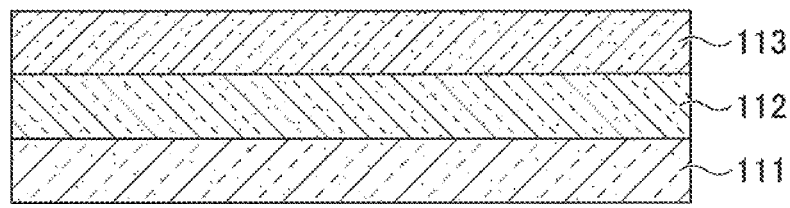
FIG. 5 is a structural drawing illustrating a semiconductor crystal substrate according to a first embodiment.

A semiconductor crystal substrate according to the present embodiment is obtained based on the above-described findings. As illustrated in FIG. 5, a semiconductor crystal substrate according to the present embodiment includes a GaSb substrate 111, which is a crystal substrate, on which an n-type first GaSb layer 112 and a p-type second GaSb layer 113 are formed in this order. To be more specific, the first GaSb layer 112 is formed under the same condition as that of the GaSb layer 12a, namely is formed by MBE at the substrate temperature of 440° C. Also, the second GaSb layer 113 is formed under the same condition as that of the GaSb layer 12b, namely is formed by MBE at the substrate temperature of 520° C. Further, the GaSb substrate 111 is similar to the GaSb substrate 11.

Figure 6:
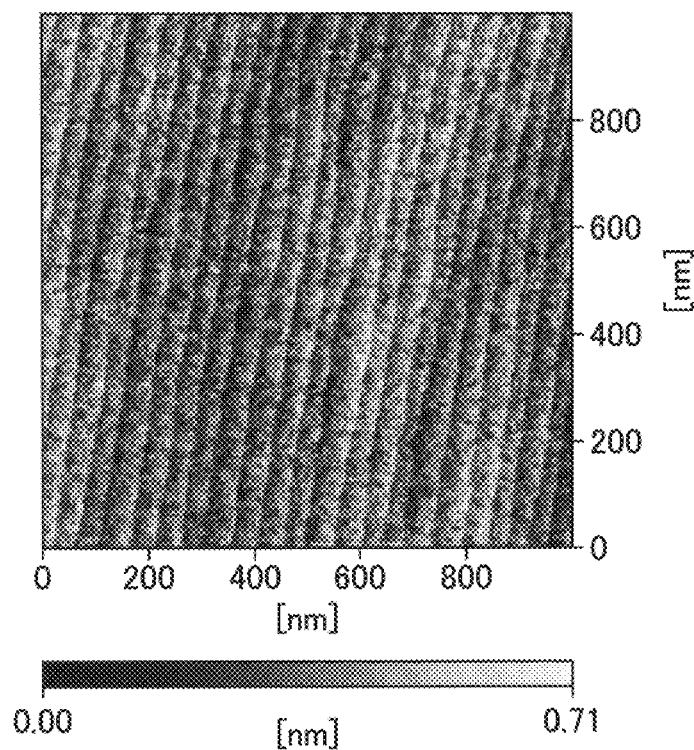
FIG. 6 is an AFM image of a GaSb layer formed on the semiconductor crystal substrate according to the first embodiment.

FIG. 6 is an AFM image of a surface of the second GaSb layer 113 formed on the first GaSb layer 112. The first GaSb layer 112 is formed on the GaSb substrate 111 after an oxide film is removed from the surface of the GaSb substrate 111. The first GaSb layer 112 is formed at the substrate temperature of 440° C. and has a thickness of 100 nm. The second GaSb layer 113 is formed at the substrate temperature of 520° C. and has a thickness of 400 nm. As illustrated in FIG. 6, surface roughness (RMS) of the surface of the formed GaSb layer is 0.10 nm and the surface is flat. Also, pits as in illustrated in FIG. 4 are not formed.

A possible reason why a film having a flat surface without pits can be obtained is because of a difference in surface migration lengths (diffusion lengths) of Ga atoms when substrate temperatures are different. Note that GaSb films are considered to grow in a step-flow mode at the substrate temperatures of both 440° C. and 520° C.

Namely, when the substrate temperature is 520° C., the surface migration length of Ga atoms is long. Accordingly, as illustrated in FIG. 4, while the flatness of a macroscopic surface can be improved, Ga atoms may fail to stably attach to microscopic recesses. As a result, pits tend to be formed.

Conversely, when the substrate temperature is 440° C., the surface migration length of Ga atoms is short. Accordingly, as illustrated in FIG. 3, while the flatness of a macroscopic surface is not sufficient, Ga atoms stably attach to microscopic recesses and the recesses are embedded. As a result, pits are not formed.

Therefore, by forming a GaSb film at the substrate temperature of 440° C. first, recesses of the uneven surface of the GaSb substrate 11 can be embedded. Subsequently, by forming a GaSb film at the substrate temperature of 520° C., the surface of the GaSb film can be made flat. In this way, a film having a flat surface without pits can be obtained. Accordingly, it is assumed that the surface roughness (RMS) of the above GaSb film becomes 0.10 nm, which is smaller than the surface roughness (RMS) 0.16 nm of the GaSb layer 12b formed at the substrate temperature of 440° C. and the surface roughness (RMS) 0.13 nm of the GaSb layer 12a formed at the substrate temperature of 520° C.

Figure 7:
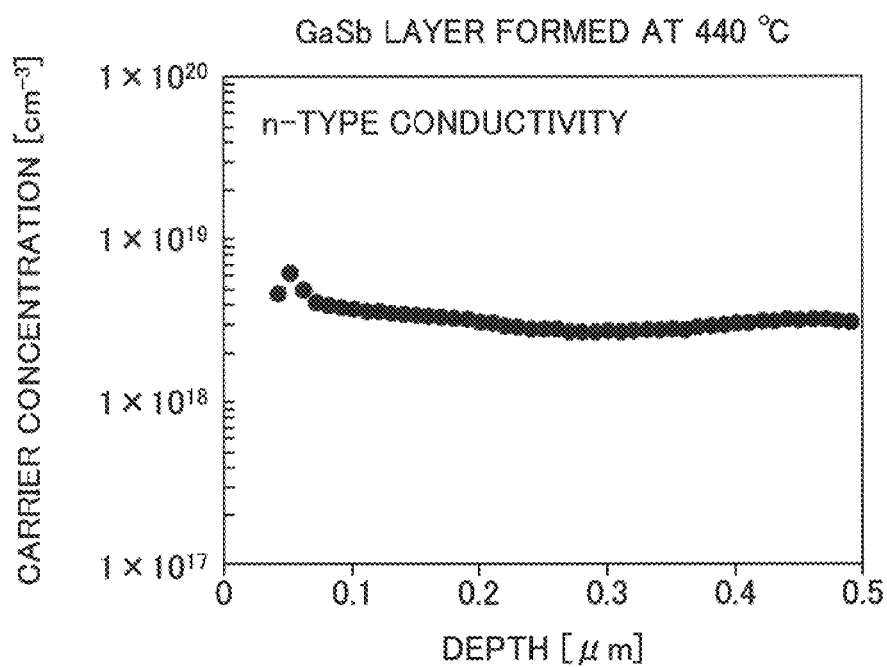
FIG. 7 is a drawing illustrating a carrier concentration in the GaSb layer formed at a substrate temperature of 440° C.

FIG. 7 is a drawing illustrating a carrier concentration in the GaSb layer 12a formed at the substrate temperature of 440° C. The carrier concentration was measured by the CV method while etching the GaSb layer 12a in a depth direction. As illustrated, the GaSb layer 12a formed at the substrate temperature of 440° C. exhibits n-type conductivity and the carrier concentration is approximately $4 \times 10^{18}$ cm$^{-3}$.

Figure 8:
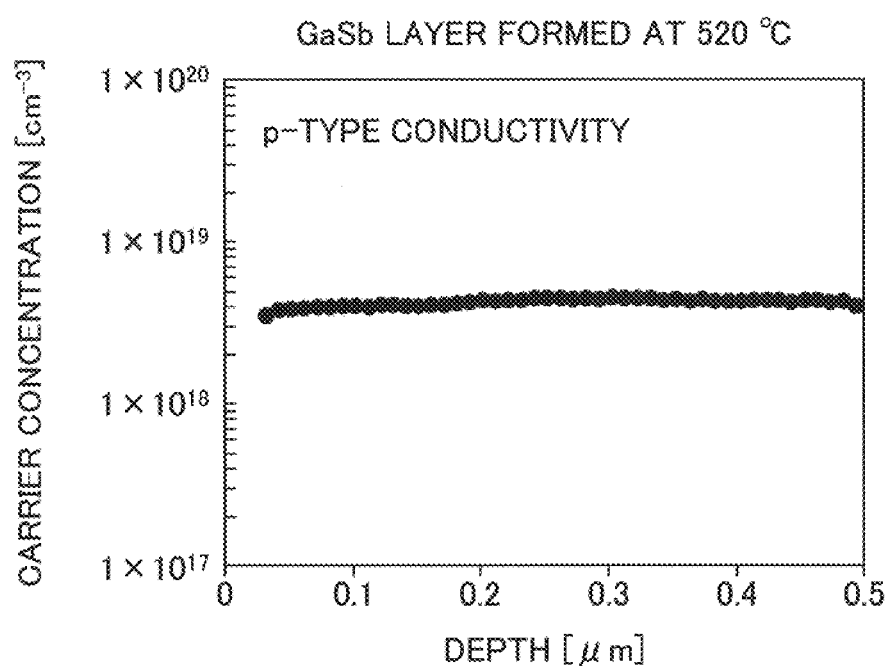
FIG. 8 is a drawing illustrating a carrier concentration in the GaSb layer formed at a substrate temperature of 520° C.

FIG. 8 is a drawing illustrating a carrier concentration in the GaSb layer 12b formed at the substrate temperature of 520° C. The carrier concentration was measured by the CV method while etching the GaSb layer 12b in the depth direction. As illustrated, the GaSb layer 12b formed at the substrate temperature of 520° C. exhibits p-type conductivity and the carrier concentration is approximately $4 \times 10^{18}$ cm$^{-3}$.

Also, a concentration of an impurity element in each of the first GaSb layer 112 and the second GaSb layer 113 is less than or equal to $1.0 \times 10^{17}$ cm$^{-3}$, similarly to that of the GaSb layer 12a and the GaSb layer 12b.

In the present embodiment, the carrier concentration in the first GaSb layer 112 having n-type conductivity and the carrier concentration in the second GaSb layer 113 having p-type conductivity are preferably greater than or equal to $1.0 \times 10^{18}$ cm$^{-3}$ and less than or equal to $1.0 \times 10^{20}$ cm$^{-3}$. The first GaSb layer 112 can be formed by solid source MBE at a substrate temperature greater than or equal to 380° C. and less than or equal to 440° C. If the temperature were less than 380° C., projections and recesses on the GaSb substrate 111 would not be sufficiently embedded because of an excessively long migration length of Ga atoms. Also, the second GaSb layer 113 can be formed by solid source MBE at a substrate temperature greater than or equal to 500° C. and less than or equal to 550° C., and more preferably at a substrate temperature greater than or equal to 520° C. and less than or equal to 550° C.

As described above, the semiconductor crystal substrate according to the present embodiment includes the GaSb substrate 111, which is a crystal substrate, on which the first GaSb layer 112 and the second GaSb layer 113 are formed in this order. The first GaSb layer 112 is rich in Sb and exhibits n-type conductivity. The second GaSb layer 113 is rich in Ga and exhibits p-type conductivity. In the present application, the first GaSb layer 112 may be referred to as a first buffer layer and the second GaSb layer 113 may be referred to as a second buffer layer.

Also in the present embodiment, the first buffer layer and the second buffer layer may be each formed of $Ga_{1-x}In_xAs_{1-y}Sb_y$ ($0 \leq x \leq 0.1$, $0 \leq y < 1$). More specifically, the first buffer layer and the second buffer layer may be each formed of GaSb, or formed of GaInSb, GaAsSb, or GaInAsSb that is a material including GaSb and one or both of In and As.

(Method for Producing Semiconductor Crystal Substrate)

Figure 9A:
FIGS. 9A through 9C are drawings illustrating a method for producing a semiconductor crystal substrate according to the first embodiment.

Next, an exemplary method for producing a semiconductor crystal substrate according to the present embodiment will be described with reference to FIGS. 9A through 9C. First, as illustrated in FIG. 9A, an n-type GaSb (001) substrate as a GaSb substrate 111 is placed in a vacuum chamber of a solid source molecular beam epitaxy (SSMBE) apparatus. Next, the GaSb substrate 111 is heated by a heater. When the substrate temperature of the GaSb substrate 111 reaches 400° C., the surface of the GaSb substrate 111 is irradiated with an Sb beam. The beam flux of Sb is, for example, $5.0 \times 10^{-7}$ torr. When the GaSb substrate 111 is further heated, an oxide film of GaSb formed on the surface of the GaSb substrate 111 is removed at a substrate temperature of around 500° C. Subsequently, the GaSb substrate 111 is heated up to a substrate temperature of 530° C. while being irradiated with the Sb beam, and is kept in this state for 20 minutes such that the oxide film of GaSb formed on the surface of the GaSb substrate 111 is completely removed.

Figure 9B:
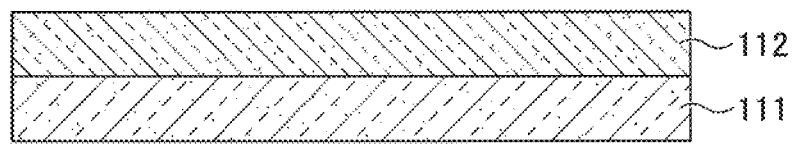

Next, as illustrated in FIG. 9B, the substrate temperature of the GaSb substrate 111 is reduced to 440° C. in a state where the Sb beam is being emitted. Then, a first GaSb layer 112 as a first buffer layer is formed on the GaSb substrate 111. To be more specific, in a state where the GaSb substrate 111 is at the substrate temperature of 440° C. and the Sb beam is being emitted, a Ga beam is also emitted so as to form the first GaSb layer 112. The beam flux of Ga is, for example, $5.0 \times 10^{-8}$ torr, and the V/III ratio is 10. Under these conditions, the growth rate of the first GaSb layer 112 is 0.30 µm/h. Irradiation of the Ga beam is stopped after approximately 20 minutes when the thickness of the first GaSb layer 113 reaches 100 μm. The first GaSb layer 112 formed at the substrate temperature of 440° C. as described above has n-type conductivity.

Figure 9C:
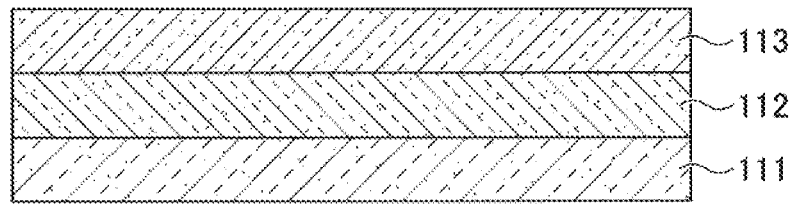

Next, as illustrated in FIG. 9C, a second GaSb layer 113 as a second buffer layer is formed on the first GaSb layer 112 as the first buffer layer. To be more specific, the substrate temperature of the GaSb substrate 111 is raised to 520° C. in a state where the Sb beam is being emitted, and the Ga beam is emitted again so as to form the second GaSb layer 113. The beam flux of Ga is, for example, $5.0 \times 10^{-8}$ torr, and the V/III ratio is 10. Under these conditions, the growth rate of the second GaSb layer 113 is 0.30 μm/h. Irradiation of the Ga beam is stopped after approximately 80 minutes when the thickness of the second GaSb layer 113 reaches 400 μm. The second GaSb layer 113 formed at the substrate temperature of 520° C. as described above has p-type conductivity.

In this way, the semiconductor crystal substrate according to the present embodiment can be produced. Although an n-type GaSb substrate is used as the GaSb substrate 111 in the present embodiment, a p-type GaSb substrate may also be used as the GaSb substrate 111. Also, the plane direction of the GaSb substrate 111 is not limited to (001), and an off-substrate may also be used as the GaSb substrate 111. Further, an InAs substrate may be used in place of the GaSb substrate 111.

Also, as a two-layer structure of the n-type first buffer layer and the p-type second buffer layer is formed, the first buffer layer may include an element isolation layer such that electric crosstalk can be prevented in an array-type device such as a semiconductor laser or an infrared detector.

Second Embodiment

Figure 10:
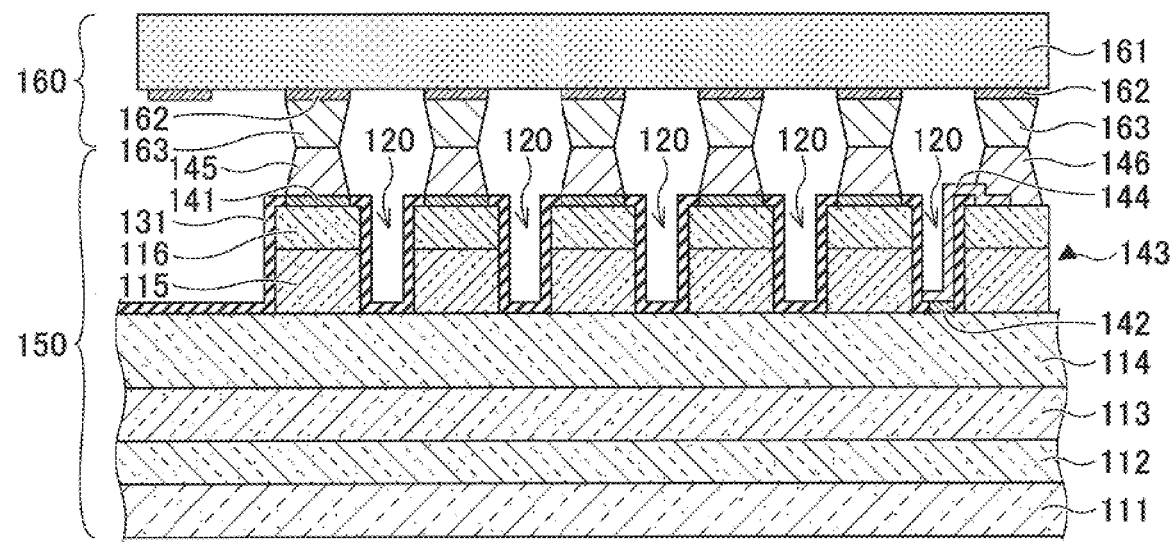
FIG. 10 is a structural drawing illustrating an infrared detector according to a second embodiment.
Figure 11:
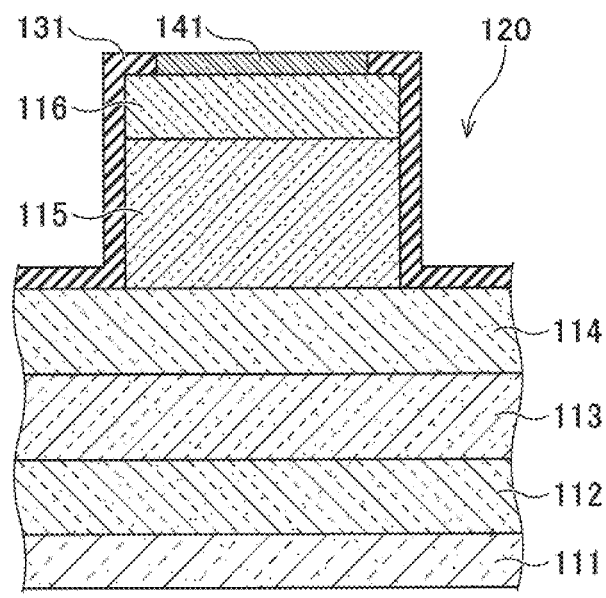
FIG. 11 is a structural drawing illustrating a main part of the infrared detector according to a second embodiment.

Next, a second embodiment will be described. In the second embodiment, an infrared detector produced by using the semiconductor crystal substrate according to the first embodiment will be described. FIG. 10 is a structural drawing illustrating the entire structure of an infrared detector according to the second embodiment. FIG. 11 illustrates a structure in which one pixel of the infrared detector is enlarged.

As illustrated in FIG. 10 and FIG. 11, in the infrared detector according to the present embodiment, a first GaSb layer 112, a second GaSb layer 113, a p-type contact layer 114, an infrared absorption layer 115, and an n-type contact layer 116 are stacked in this order on a GaSb substrate 111. The GaSb substrate 111 is an n-type GaSb (001) substrate, the first GaSb layer 112 has a thickness of approximately 100 nm, and the second GaSb layer 113 has a thickness of approximately 400 nm. The p-type contact layer 114 is a p-type GaSb layer that has a thickness of 500 nm and is doped with Be as an impurity element. The infrared absorption layer 115 has an InAs/GaSb superlattice (T2SL) structure. To be more specific, the infrared absorption layer 115 is formed by alternately stacking an InAs layer with a thickness of approximately 2 nm and a GaSb layer with a thickness of approximately 2 nm, such that the infrared absorption layer 115 includes 200 pairs of the InAs layer and the GaSb layer and has a thickness of approximately 800 nm. The n-type contact layer 116 is an n-type InAs layer that has a thickness of approximately 30 nm and is doped with Si as an impurity element. In the present application, the p-type contact layer 114 may be referred to as a first contact layer, and the n-type contact layer 116 may be referred to as a second contact layer.

Also, pixel separating grooves 120 for separating pixels are formed in the n-type contact layer 116 and the infrared absorption layer 115. A passivation film 131 composed of SiN is formed on the side surfaces and the bottom surfaces of the pixel separating grooves 120. In the infrared detector according to the present embodiment, multiple pixels separated by the pixel separating grooves 120 are arranged two-dimensionally. An electrode 141 is formed on the n-type contact layer 116 of each of the pixels separated by the pixel separating grooves 120, and an electrode 142 is formed on the p-type contact layer 114. In the vicinity of the electrode 142, a wiring support 143 is configured by the infrared absorption layer 115 and the n-type contact layer 116. Also, a wiring layer 144 is formed so as to extend from the electrode 142 via the side surface of the wiring support 143 to the upper surface of the wiring support 143. Accordingly, the infrared absorption layer 115 and the n-type contact layer 116 forming the wiring support 143 are not used for infrared detection. The electrodes 141 and 142 are formed of a metal laminated film made of Ti, Pt, and Au. In the present embodiment, a device configured as described above may be referred to as an infrared detector or an infrared detecting device 150. The infrared detector according to the present embodiment can detect infrared radiation incident from the back surface of the GaSb substrate 111.

Figure 12:
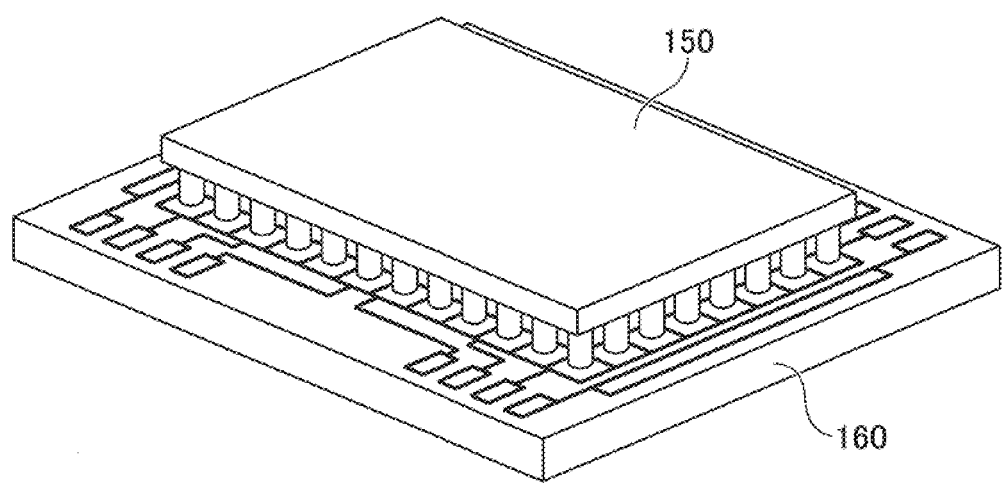
FIG. 12 is a perspective view of the infrared detector according to the second embodiment.

As illustrated in FIG. 10, in the infrared detector according to the present embodiment, a signal readout circuit device 160 is connected to the infrared detecting device 150. For this connection, bumps 145 are formed on the electrodes 141 of the infrared detecting device 150, and a bump 146 is formed on the wiring layer 144 of the infrared detecting device 150. Also, the signal readout circuit device 160 includes a circuit board 161 on which a signal readout circuit is formed. Electrodes 162 are formed on the circuit board 161, and bumps 163 are formed on the electrodes 162. The bumps 145 and 146 and the bumps 163 are disposed facing each other. The infrared detecting device 150 and the signal readout circuit device 160 are connected to each other by connecting the bumps 145 and 146 to the corresponding bumps 163. FIG. 12 is a perspective view of the infrared detector according to the present embodiment. (Method for Producing Infrared Detector)

Next, a method for producing an infrared detector according to the present embodiment will be described with reference to FIGS. 13A through 16B. The infrared detector according to the present embodiment can be produced by using the semiconductor crystal substrate according to the first embodiment. FIGS. 13A, 14A, 15A, and 16A each illustrate a structure involved in a corresponding process, and FIGS. 13B, 14B, 15B, and 16B each illustrate an enlarged part corresponding to one pixel.

Figure 13A:
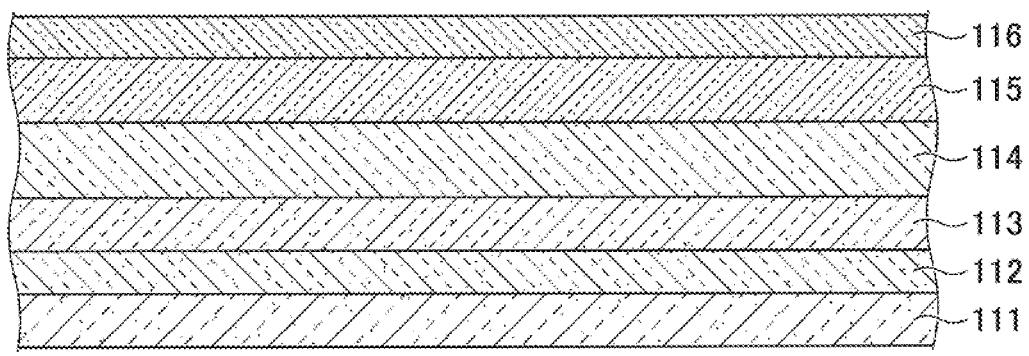
FIGS. 13A and 13B are drawings illustrating a process (1) of a method for producing a semiconductor crystal substrate according to the second embodiment.
Figure 13B:
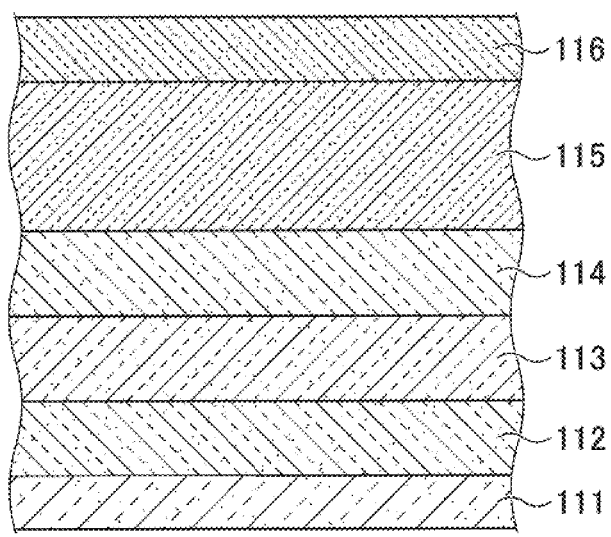

First, as illustrated in FIGS. 13A and 13B, the first GaSb layer 112, the second GaSb layer 113, a p-type contact layer 114, the infrared absorption layer 115, and the n-type contact layer 116 are formed in this order on the GaSb substrate 111 by MBE epitaxial growth. A structure obtained by sequentially forming the first GaSb layer 112 and the second GaSb layer 113 on the GaSb substrate 111 corresponds to the semiconductor crystal substrate according to the first embodiment. Therefore, detailed descriptions of the GaSb substrate 111, the first GaSb layer 112, and the second GaSb layer 113 will be omitted.

To be more specific, the first GaSb layer 112 and the second GaSb layer 113 are sequentially formed on the GaSb substrate 111, and the p-type contact layer 114 is formed on the second GaSb layer 113. The p-type contact layer 114 is a p-type GaSb layer that is formed by emitting Ga, Sb, and Be beams at a substrate temperature of 520° C. At this time, the temperature of a Be cell is adjusted such that the concentration of Be, which is an impurity element used as a dopant of the p-type contact layer 114, becomes $5.0 \times 10^{18}$ cm$^{-3}$. Also, the beam flux of Ga is $5.0 \times 10^{-8}$ torr, the beam flux of Sb is $5.0 \times 10^{-7}$ torr, and the V/III ratio is 10. Under these conditions, the growth rate of GaSb is 0.30 μm/h. Irradiation of the Be and Ga beams is stopped after approximately 100 minutes when the thickness of the p-type contact layer 114 reaches 500 μm.

Subsequently, the infrared absorption layer 115 with an InAs/GaSb superlattice structure is formed on the p-type contact layer 114. To be more specific, in a state where the Sb beam is being emitted, the substrate temperature of the GaSb substrate 111 is reduced to 440° C. Then, irradiation of the Sb beam is stopped and In and As beams are emitted. At this time, the beam flux of In is $5.0 \times 10^{-8}$ torr, the beam flux of As is $5.0 \times 10^{-7}$ torr, and the V/III ratio is 10. Under these conditions, the growth rate of InAs is 0.30 μm/h. Irradiation of the In and As beams is stopped after approximately 36 seconds when the thickness of an InAs layer reaches 2 μm. Next, after an interval of three seconds, Ga and Sb beams are emitted. At this time, the beam flux of Ga is $5.0 \times 10^{-8}$ torr, the beam flux of Sb is $5.0 \times 10^{-7}$ torr, and the V/III ratio is 10. Under these conditions, the growth rate of GaSb is 0.30 μm/h. Irradiation of the Ga and Sb beams is stopped after approximately 36 seconds when the thickness of a GaSb layer reaches 2 μm. After an interval of three seconds, the above process is repeated. When the above process of InAs layer formation and GaSb layer formation is regarded as one cycle, the cycle is repeated 200 times such that the infrared absorption layer 115 with a total thickness of approximately 800 nm is formed.

Next, the n-type contact layer 116 is formed on the infrared absorption layer 115. The n-type contact layer 116 is an n-type InAs layer that is formed by emitting In, As, and Si beams. At this time, the temperature of a Si cell is adjusted such that the concentration of Si, which is an impurity element used as a dopant of the n-type contact layer 116, becomes $5.0 \times 10^{18}$ cm$^{-3}$. Also, the beam flux of In is $5.0 \times 10^{-8}$ torr, the beam flux of As is $5.0 \times 10^{-7}$ torr, and the V/III ratio is 10. Under these conditions, the growth rate of InAs is 0.30 μm/h. Irradiation of the In and Si beams is stopped after approximately 6 minutes when the thickness of an InAs layer reaches 30 μm.

Next, in a state where the As beam is being emitted, the substrate temperature is reduced to 400° C. Then, irradiation of the As beam is stopped, and a structure where epitaxial films are formed on the GaSb substrate 111 is taken out from the vacuum chamber of the MBE apparatus.

Figure 14A:
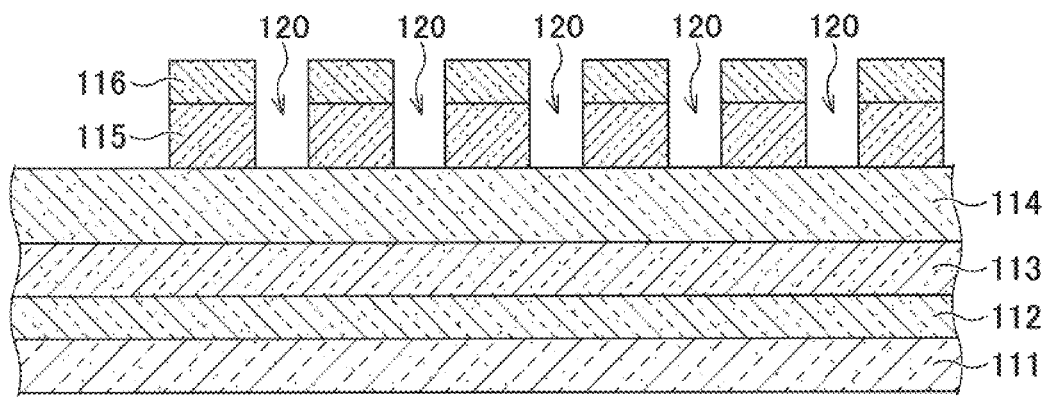
FIGS. 14A and 14B are drawings illustrating a process (2) of the method for producing the semiconductor crystal substrate according to the second embodiment.
Figure 14B:
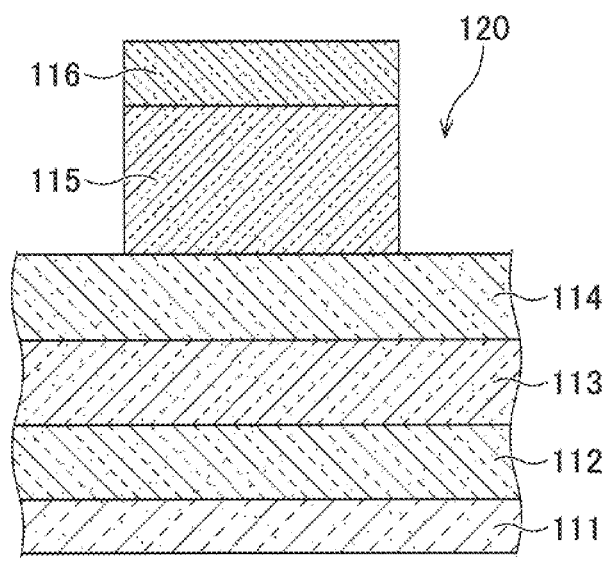

Next, as illustrated in FIGS. 14A and 14B, portions of the n-type contact layer 116 and the infrared absorption layer 115 are removed so as to form pixel separating grooves 120. To be more specific, a photoresist is applied to the n-type contact layer 116, and the photoresist is exposed and developed by an exposure apparatus so as to form a resist pattern (not illustrated) having openings in areas where the pixel separating grooves 120 are to be formed. Then, portions of the n-type contact layer 116 and the infrared absorption layer 115 in the areas not covered by the resist pattern are removed by dry etching using $CF_4$ gas. As a result, the pixel separating grooves 120 are formed. By forming pixel separating grooves 120 in this way, pixels having mesa structures and separated by the pixel separating grooves 120 are formed. In the present embodiment, the size of one pixel is 50 μm×50 μm, and 256×256 pixels are formed in the infrared detector.

Figure 15A:
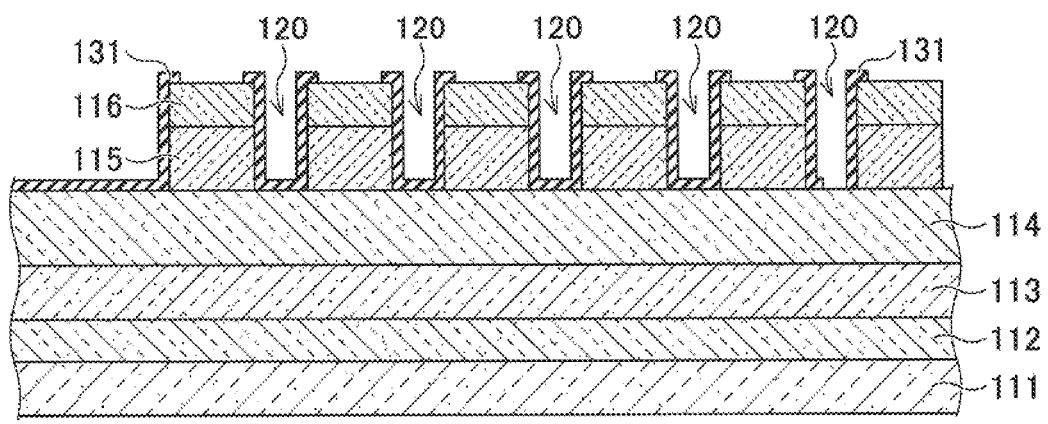
FIGS. 15A and 15B are drawings illustrating a process (3) of the method for producing the semiconductor crystal substrate according to the second embodiment.
Figure 15B:
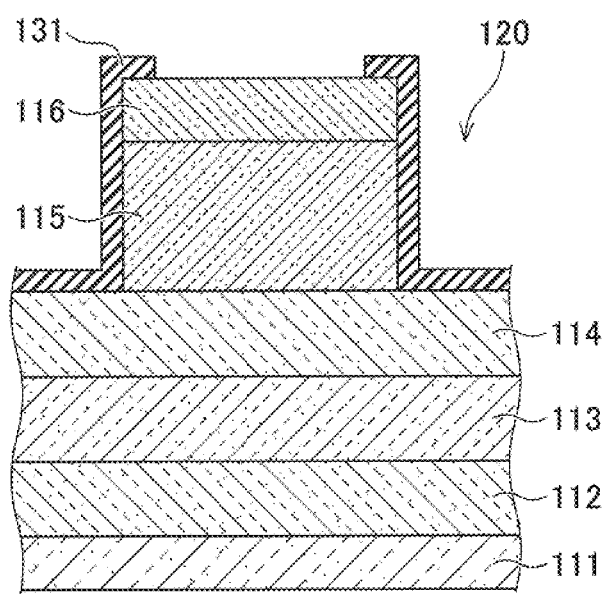

Next, as illustrated in FIGS. 15A and 15B, the passivation film 131 is formed on the upper surface of the n-type contact layer 116, on the side surfaces of the n-type contact layer 116 and the infrared absorption layer 115, which form the pixels, and on the upper surface of the p-type contact layer 114 between the pixels. The passivation film 131 is an SiN film with a thickness of 100 nm and is formed by plasma chemical vapor deposition (CVD) using $SiH_4$ gas and $NH_3$ gas.

Subsequently, a photoresist is applied, and the photoresist is exposed and developed by an exposure apparatus so as to form a resist pattern (not illustrated) having openings in areas where the electrodes 141 and 142 are to be formed. Then, portions of the passivation film 131 in the areas not covered by the resist pattern are removed by dry etching using $CF_4$ gas such that the n-type contact layer 116 and the p-type contact layer 114 in those areas are exposed.

Figure 16A:
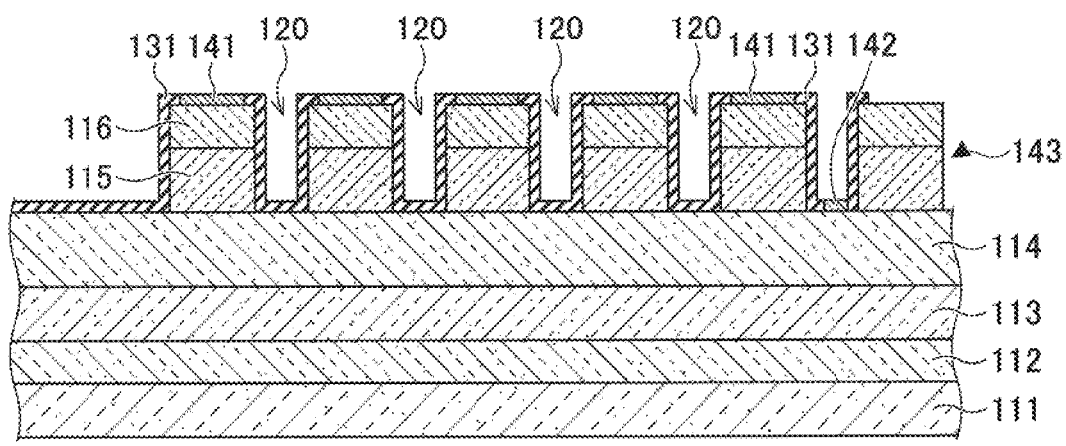
FIGS. 16A and 16B are drawings illustrating a process (4) of the method for producing the semiconductor crystal substrate according to the second embodiment.
Figure 16B:
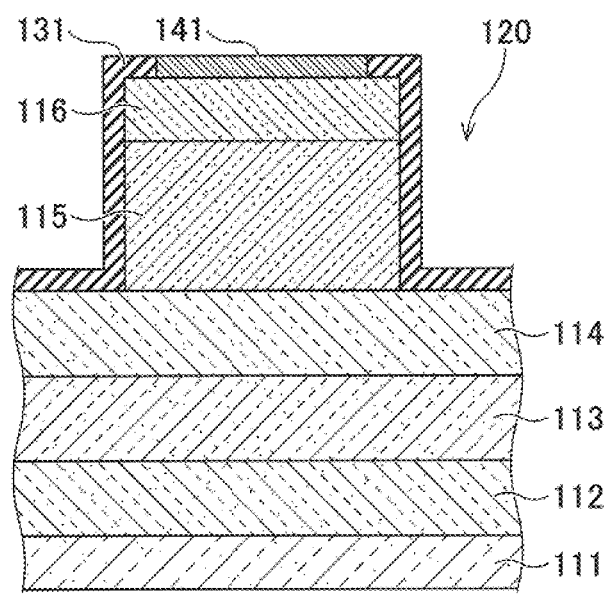

Next, as illustrated in FIGS. 16A and 16B, the electrodes 141 are formed on the exposed portions of the n-type contact layer 116 and the electrode 142 is formed on the exposed portion of the p-type contact layer 114. Specifically, a resist pattern (not illustrated) is formed, which has openings in areas where the electrodes 141 and 142 are to be formed. Next, a metal laminated film made of Ti, Pt, and Au is formed by vacuum deposition or sputtering. After immersion in an organic solvent, for example, the metal multilayer film formed on the resist pattern is removed by a lift-off technique, together with the resist pattern. The remaining portions of the metal multilayer film form the electrodes 141 on the n-type contact layer 116 and form the electrode 142 on the p-type contact layer 114.

Next, as illustrated in FIG. 10, the wiring layer 144 is formed on the electrode 142 and the side surface and the upper surface of the wiring support 143. Also, the bumps 145 are formed on the electrodes 141, and the bump 146 is formed on the wiring layer 144 above the wiring support 143. The formed bumps 145 and 146 are connected to the bumps 163 of the signal readout circuit device 160 by flip-chip bonding. As a result, the infrared detecting device 150 and the signal readout circuit device 160 are connected to each other.

Details other than the above are the same as those in the first embodiment.

Third Embodiment

Figure 17:
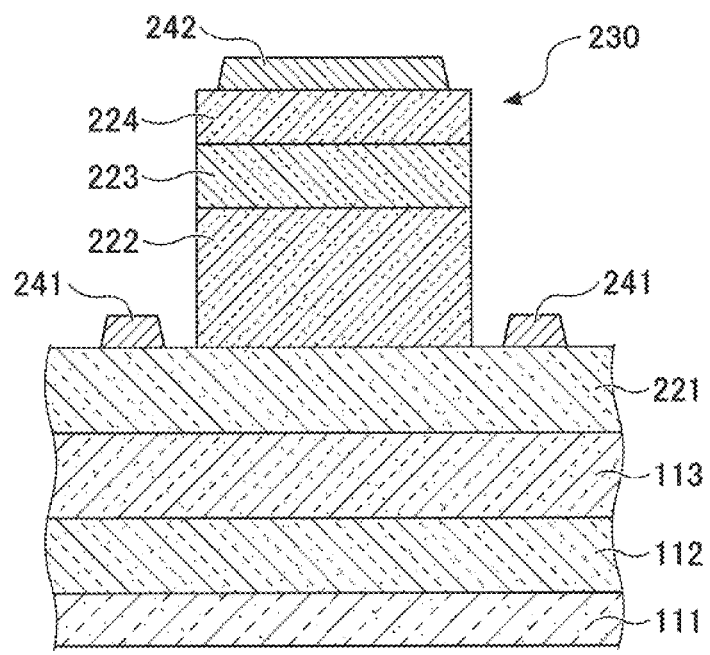
FIG. 17 is a structural drawing illustrating a semiconductor laser according to a third embodiment.

Next, a third embodiment will be described. In the present embodiment, a GaSb semiconductor laser produced as a photosemiconductor device by using the semiconductor crystal substrate according to the first embodiment will be described. FIG. 17 illustrates a configuration of a semiconductor laser according to the third embodiment.

The semiconductor laser according to the present embodiment uses the semiconductor crystal substrate according to the first embodiment in which the first GaSb layer 112 and the second GaSb layer 113 are formed on the GaSb substrate 111. A p-type GaSb cladding layer 221, a multi-quantum well (MQW) layer 222, an n-type GaSb cladding layer 223, and an n-type InAs layer 224 are formed in this order on the second GaSb layer 113. The p-type GaSb cladding layer 221 has a thickness of approximately 500 nm and is doped with Be as a p-type impurity element. The MQW layer 222 is a light emitting layer having a multi-quantum well structure in which a GaSb layer with a thickness of approximately 5 nm and an InAs layer with a thickness of approximately 5 nm are alternately formed. In the present embodiment, the MQW layer 222 includes 20 pairs of the GaSb layer and the InAs layer. The n-type GaSb cladding layer 223 has a thickness of approximately 100 nm, is doped with Si as an n-type impurity element, and has a carrier concentration of $5.0\times10^{18}$ cm$^{-3}$. The n-type InAs layer 224 has a thickness of approximately 30 nm.

Next, portions of the n-type InAs layer 224, the n-type GaSb cladding layer 223, and the MQW layer 222 are removed so as to form a mesa structure 230. To be more specific, portions of the n-type InAs layer 224, the n-type GaSb cladding layer 223, and the MQW layer 222 are removed by dry etching using $CF_4$ gas as an etching gas such that portions of the p-type GaSb cladding layer 221 are exposed and thereby a mesa structure 230 is formed.

Next, lower electrodes 241 are formed on the exposed portions of the p-type GaSb cladding layer 221, and an upper electrode 242 is formed on the n-type InAs layer 224. The lower electrodes 241 and the upper electrode 242 are each formed of a metal multilayer film made of Ti, Pt, and Au, for example.

Subsequently, the GaSb substrate 111 is cleaved so as to be formed in a stripe shape having a width of 20 μm and a length of 50 μm. As a result, the semiconductor laser according to the present embodiment can be produced. The semiconductor laser is an edge emitting laser with a wavelength of 3.0 μm.

Fourth Embodiment

Figure 18:
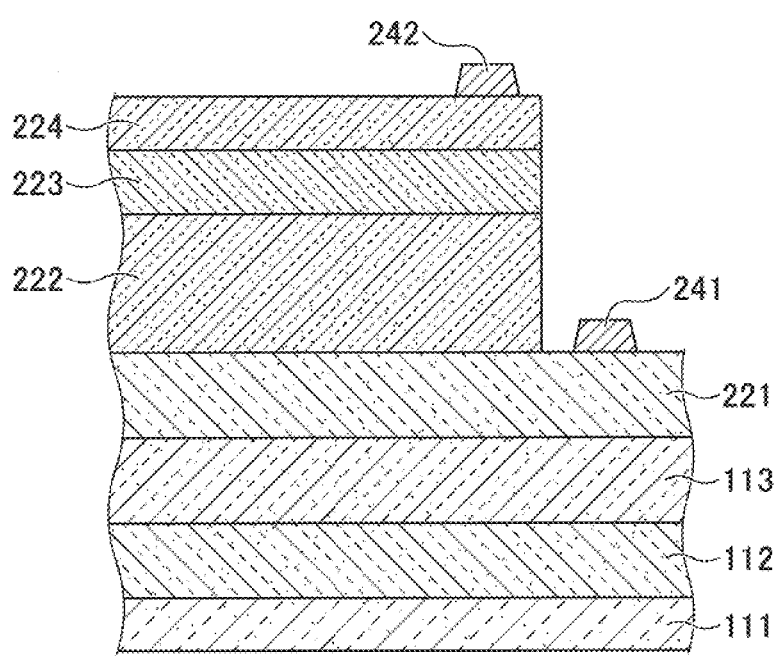
FIG. 18 is a structural drawing illustrating a light emitting diode according to a fourth embodiment.

Next, a fourth embodiment will be described. In the present embodiment, a GaSb light emitting diode (LED) produced as a photosemiconductor device produced by using the semiconductor crystal substrate according to the first embodiment will be described. FIG. 18 illustrates a configuration of a light emitting diode according to the present embodiment.

The light emitting diode according to the fourth embodiment uses the semiconductor crystal substrate according to the first embodiment. After layers similarly to those of the third embodiment are formed by MBE epitaxial growth, a lower electrode 241 and an upper electrode 242 are formed.

Subsequently, the GaSb substrate 111 is cleaved so as to be formed in a chip shape having a width of 50 μm and a length of 50 μm. As a result, the light emitting diode according to the present embodiment can be produced. Because the light emitting diode emits light from the side on which the n-type InAs layer 224 is formed, an area of the n-type InAs layer 224 where the upper electrode 242 is not formed is preferably as large as possible.

Fifth Embodiment

Figure 19:
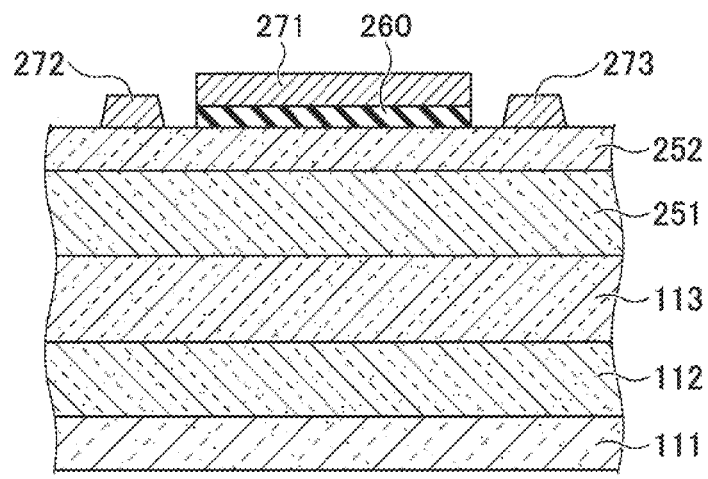
FIG. 19 is a structural drawing illustrating a field-effect transistor according to a fifth embodiment.

Next, a fifth embodiment will be described. In the present embodiment, a field-effect transistor (FET) produced as a semiconductor device by using the semiconductor crystal substrate according to the first embodiment will be described. FIG. 19 illustrates a configuration of a field-effect transistor according to the present embodiment.

The field effect transistor according to the fifth embodiment uses the semiconductor crystal substrate according to the first embodiment in which the first GaSb layer 112 and the second GaSb layer 113 are formed on the GaSb substrate 111. An $Al_{0.8}Ga_{0.2}Sb$ layer 251 and a channel layer 252 are formed by MBE on the second GaSb layer 113. The $Al_{0.8}Ga_{0.2}Sb$ layer 251 has a thickness of approximately 200 nm. The channel layer 252 is a p-type $In_{0.2}Ga_{0.8}Sb$ layer with a thickness of 5 nm, is doped with Be as a p-type impurity element, and has a carrier concentration of $5.0\times10^{18}$ cm$^{-3}$.

Next, an insulating film 260 is formed by atomic layer deposition (ALD) on the channel layer 252. The insulating film 260 is an $Al_2O_3$ film with a thickness of 3 nm.

Next, a gate electrode 271 is formed on the insulating film 260, and a source electrode 272 and a drain electrode 273 are formed on the channel layer 252. The gate electrode 271 may be a tungsten (W) film with a thickness of approximately 100 nm, and may be formed by CVD on the insulating layer 260. The gate electrode 271 is formed so as to have a gate length of 30 nm. Subsequently, portions of the insulating film 260, which correspond to areas where the source electrode 272 and the drain electrode 273 are to be formed, are removed. Then, the source electrode 272 and the drain electrode 273 are formed with, for example, Ni films.

Accordingly, the field-effect transistor according to the present embodiment can be produced.

Sixth Embodiment

Next, a sixth embodiment will be described. In the present embodiment, a thermoelectric transducer produced by using the semiconductor crystal substrate according to the first embodiment will be described. By referring to FIG. 20 and FIG. 21, a thermoelectric transducer according to the present embodiment will be described.

The thermoelectric transducer according to the sixth embodiment uses the semiconductor crystal substrate according to the first embodiment in which the first GaSb layer 112 and the second GaSb layer 113 are formed on the GaSb substrate 111. A superlattice layer 280 and a cap layer 281 are sequentially formed by MBE on the second GaSb layer 113. The superlattice layer 280 is formed by alternately stacking a GaSb layer with a thickness of approximately 5 nm and an InAs layer with a thickness of approximately 5 nm. In the present embodiment, the superlattice layer 280 includes 500 pairs of the GaSb layer and the InAs layer. The cap layer 281 is a non-doped InAs film with a thickness of 30 nm.

Figure 20:
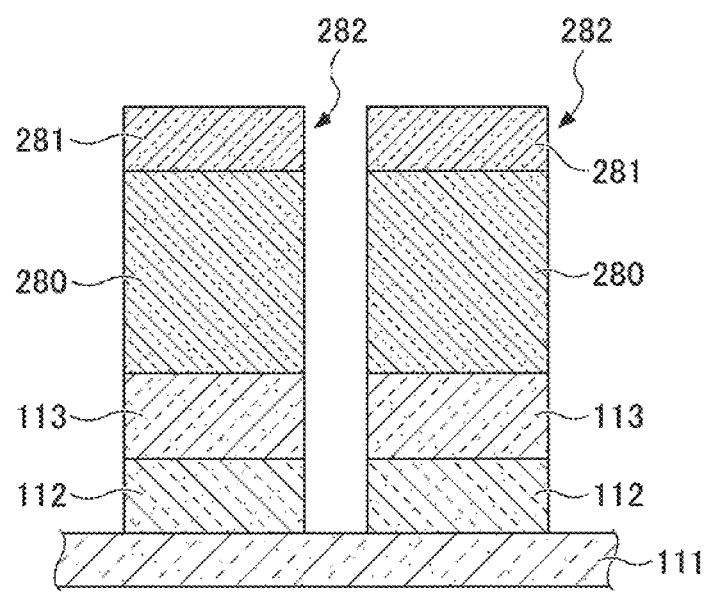
FIG. 20 is a drawing (1) illustrating a thermoelectric transducer according to a sixth embodiment.
Figure 21:
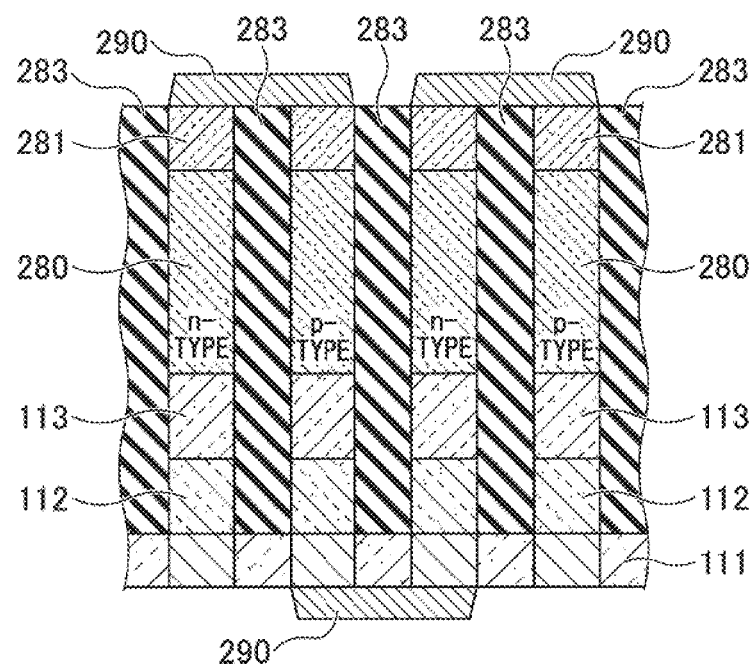
FIG. 21 is a drawing (2) illustrating the thermoelectric transducer according to the sixth embodiment.

Next, portions of the cap layer 281, the superlattice layer 280, the second GaSb layer 113, and the first GaSb layer 112 are removed so as to form mesa structures 282. To be more specific, portions of the cap layer 281, the superlattice layer 280, the second GaSb layer 113, and the first GaSb layer 112 are removed by dry etching using $CF_4$ gas as an etching gas so as to form mesa structures 282. FIG. 20 illustrates the structures.

Next, a $SiO_2$ film 283 is formed by CVD such that a gap between the mesa structures 282 is filled. Next, the back surface of the GaSb substrate 111 is polished by chemical mechanical polishing (CMP) so as to reduce the thickness of the GaSb substrate 111 to approximately 3 μm. Next, impurity ions used as n-type and p-type dopants are ion-implanted into the mesa structures 282 and activation annealing is performed so as to form n-type regions (n-type elements) and p-type regions (p-type elements). Subsequently, electrodes 290 are formed on both sides such that the n-type elements and the p-type elements are connected in series. Each of the electrodes 290 is formed of a metal multilayer film made of Ti, Pt, and Au, for example.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention have been described in detail, it should be understood that various changes, substitutions, and alterations could be made hereto without departing from the spirit and scope of the invention.

What is claimed is:

1. A method for producing a semiconductor crystal substrate, the method comprising:
   forming a first buffer layer on a crystal substrate by molecular beam epitaxy with a material including GaSb, the crystal substrate being formed of a material including GaSb or InAs; and
   forming a second buffer layer on the first buffer layer by molecular beam epitaxy with a material including GaSb,
   wherein the first buffer layer is formed at a substrate temperature greater than or equal to 380° C. and less than or equal to 440° C., and
   the second buffer layer is formed at a substrate temperature greater than or equal to 500° C. and less than or equal to 550° C.

2. The method for producing the semiconductor crystal substrate according to claim 1, wherein the second buffer layer is formed at a substrate temperature greater than or equal to 520° C. and less than or equal to 550° C.

3. The method for producing the semiconductor crystal substrate according to claim 1, wherein the molecular beam epitaxy is solid source molecular beam epitaxy.

4. The method for producing the semiconductor crystal substrate according to claim 1, wherein the first buffer layer is formed of a material including GaSb and one or both of In and As, and the second buffer layer is formed of a material including GaSb and one or both of In and As.

* * * * *